US012641937B2

(12) United States Patent
Zhang et al.

(10) Patent No.: US 12,641,937 B2
(45) Date of Patent: May 26, 2026

(54) LIGHT-EMITTING CHIP HOLDER WITH MULTIPLE PADS PAIRS, AND LIGHT-EMITTING DEVICE

(71) Applicant: KAISTAR Lighting (Xiamen) Co., Ltd., Xiamen (CN)

(72) Inventors: Jingqiong Zhang, Xiamen (CN); Yiqun Li, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 460 days.

(21) Appl. No.: 18/129,679

(22) Filed: Mar. 31, 2023

(65) Prior Publication Data

US 2024/0304772 A1     Sep. 12, 2024

(30) Foreign Application Priority Data

Mar. 9, 2023    (CN) .......................... 202310224646.7

(51) Int. Cl.
H10H 20/857 (2025.01)
H10H 20/858 (2025.01)

(52) U.S. Cl.
CPC ...... H10H 20/857 (2025.01); H10H 20/8582 (2025.01)

(58) Field of Classification Search
CPC ............. H10H 20/857; H10H 20/8506; H10H 29/142; H10H 20/0364; H10H 20/813; H10H 20/8514; H10H 20/8582
USPC .............. 257/81, 88, 99, 100, 676, E23.141, 257/E25.02, E33.057
See application file for complete search history.

(56) References Cited

U.S. PATENT DOCUMENTS

2009/0294780 A1* 12/2009 Chou ..................... H05B 33/12
257/E33.061

* cited by examiner

*Primary Examiner* — David Chen
(74) *Attorney, Agent, or Firm* — Hemisphere Law, PLLC

(57) ABSTRACT

A light-emitting chip holder includes a conductive base and a casing. The conductive base includes pad pairs spaced along a first direction, and each pad pair includes a connection pad and a bonding pad spaced along a second direction different from the first direction. The connection pad includes a main portion and an extension portion. The bonding pad includes first and second bonding portions. The casing forms concave groups on a side of the conductive base. The concave group includes first and second concaves adjacent to each other in the second direction. The pad pairs includes adjacently arranged first and second pad pairs. In each the concave group, the first pad pair and the second pad pair are arranged in a centrosymmetric manner. A flexible series-connection and/or parallel-connection design for light-emitting devices can be conveniently realized.

20 Claims, 6 Drawing Sheets

LIGHT-EMITTING CHIP HOLDER WITH MULTIPLE PADS PAIRS, AND LIGHT-EMITTING DEVICE

TECHNICAL FIELD

The disclosure relates to the field of photoelectric devices, and more particularly to a light-emitting chip holder and a light-emitting device.

BACKGROUND

A light-emitting chip holder is also called as a lead frame, and on which a LED chip(s) can be pasted, wired and encapsulated to form a LED light-emitting device consequently. An existing LED holder generally is equipped with one pair of positive and negative electrodes, and thus encounters problems such as difficult to be connected in series and/or in parallel in a packaging stage.

SUMMARY

Accordingly, embodiments of the disclosure provide a light-emitting chip holder and a light-emitting device, which have a characteristic of realizing a series-connection and/or parallel-connection design flexibly in the light-emitting device.

Specifically, in an aspect, an embodiment of the disclosure provides a light-emitting chip holder, including: a conductive base and a casing. The conductive base includes a plurality of pad pairs spaced along a first direction, and each pad pair of the plurality of pad pairs includes a connection pad and a bonding pad spaced along a second direction. The second direction is different from the first direction. The connection pad includes a main portion and an extension portion, and the bonding pad includes a first bonding portion and a second bonding portion. The casing is disposed on the conductive base and forming a concave group on a side of the conductive base. The concave group includes a first concave and a second concave adjacent to each other in the second direction. The plurality of pad pairs includes a first pad pair and a second pad pair adjacent to each other. For the first pad pair, the main portion is located in the first concave, the extension portion is connected to the main portion and extends into the second concave along the second direction, the first bonding portion is located in the second concave and adjacent to the extension portion in the second direction, and the second bonding portion connected to a side of the first bonding portion facing toward the second pad pair. In the concave group, the first pad pair and the second pad pair are arranged in a centrosymmetric manner.

It can be seen that the above embodiment of the disclosure can achieve one or more of the following beneficial effects: through the layout design of the first pad pair and the second pad pair corresponding to each concave group, the second pad pair and the first pad pair are arranged in a centrosymmetric manner in the corresponding concave group, so that the first concave is disposed inside with the main portion of the connection pad of the first pad pair, and the extension portion of the connection pad and the bonding pad of the second pad pair; that is, there are three connectable pads in the first concave, and the second concave is the like, so that there are three connectable pads in each concave of the casing. In addition, through the layout design of the conductive base, in the case of multiple pads, the area of the bonding pad in each concave is as large as possible, which can achieve a larger die bonding area, a better heat dissipation effect which can improve the luminous efficiency.

Other aspects and features of the disclosure will become apparent from the following detailed description with reference to the accompanying drawings. It should be understood: the drawings are for the purpose of illustration only and are not intended as a limitation of the scope of the disclosure. It should also be understood that the drawings are not necessarily to scale unless otherwise indicated, and are merely intended to conceptually illustrate the structures and procedures described herein.

BRIEF DESCRIPTION OF DRAWINGS

In order to illustrate technical solutions of embodiments of the disclosure more clearly, drawings used in the description of the embodiments will be briefly described below. Apparently, the drawings described below are merely some embodiments of the disclosure, and those skilled in the art can obtain other drawings based on these drawings without creative effort.

DESCRIPTION OF REFERENCE NUMERALS IN THE DRAWINGS

100: light-emitting chip holder, 200: light-emitting device, 10: electrically-conductive base, 11: pad pair, 11*a*: first pad pair, 11*b*: second pad pair, 111: connection pad, 1111: main portion, 1112: extension portion, 112: bonding pad, 1121: first bonding portion, 1122: second bonding portion, 20: casing, 21: concave group, 211: first concave, 212: second concave, 213: first bottom edge, 214: second bottom edge, 30: light-emitting chip, 31: first light-emitting chip, 32: second light-emitting chip.

DETAILED DESCRIPTION OF EMBODIMENTS

In order to make purposes, technical solutions and advantages of embodiments of the disclosure more clearly, the technical solutions in the embodiments of the disclosure will be described clearly and completely with reference to the accompanying drawings. Apparently, the described embodiments are only some of embodiments of the disclosure, rather than all of embodiments of the disclosure. Based on the described embodiments of the disclosure, all other embodiments obtained by those skilled in the art without creative effort shall fall within the scope of protection of the disclosure.

It is noted that, in the embodiments, the appended claims and the accompanying drawings of the disclosure, terms "first", "second", etc. are used only to distinguish similar objects, rather than to describe a specific order or sequence. It should be understood that the terms used in this way may be interchanged under appropriate circumstances so that the embodiments of the disclosure described herein may be implemented in other orders than those illustrated or described herein. Moreover, terms "including" and "having" and any variations thereof are intended to cover a non-exclusive inclusion, e.g., a process, a method, a system, a product, or an apparatus that includes a series of steps or elements is not necessarily limited to explicitly listed steps or elements, but may include other steps or elements not expressly listed or inherent to such process, method, product, or apparatus. In addition, what needs to be supplemented is that the description of "symmetrical", "symmetric" in the specification of the disclosure ignores differences caused by concaves, a chamfer of casing and positive or negative mark of casing appearance.

In addition, it should be noted that the division of various embodiments of the disclosure is only for the convenience of description and should not constitute a particular limitation, and features in the various embodiments may be combined and referenced mutually on the prerequisite of without contradiction.

Figure 1:
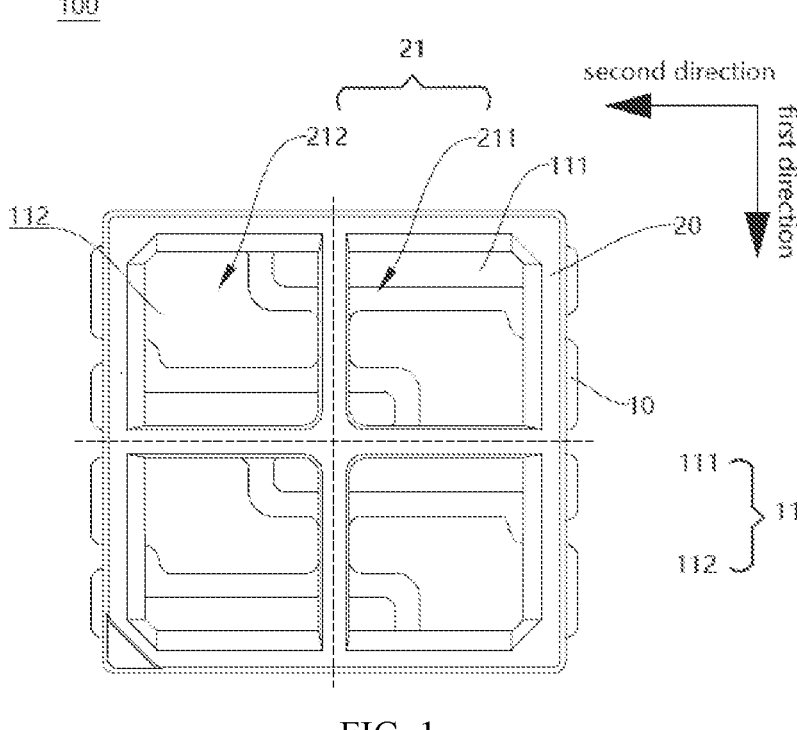
FIG. 1 illustrates a schematic front structural view of a light-emitting chip holder according to an embodiment of the disclosure.

Referring to FIG. 1, an embodiment of the disclosure provides a light-emitting chip holder 100, which can be used for die bonding of light-emitting chips (e.g., LED chips), wiring, and packaging to obtain a light-emitting device (e.g., LED light-emitting device) consequently. As illustrated in FIG. 1, the light-emitting chip holder 100 includes an electrically-conductive base 10 and a casing 20 connected to the electrically-conductive base 10. The electrically-conductive base 10 includes multiple (i.e., more than one) pad pairs 11 arranged at intervals along a first direction. Each pad pair 11 of the multiple pad pairs 11 includes a connection pad 111 and a bonding pad 112 arranged at an interval along a second direction. The second direction is different from the first direction, for example, perpendicular to the first direction.

The orientation shown in FIG. 1 is taken as an example, the first direction is the upper-lower direction, and the second direction is the right-left direction, the electrically-conductive base 10 includes four rows and two columns of pads arranged at intervals roughly from upper to lower, and each pad pair 11 includes the connection pad 111 and the bonding pad 112 adjacent to each other in the right-left direction.

Figure 2:
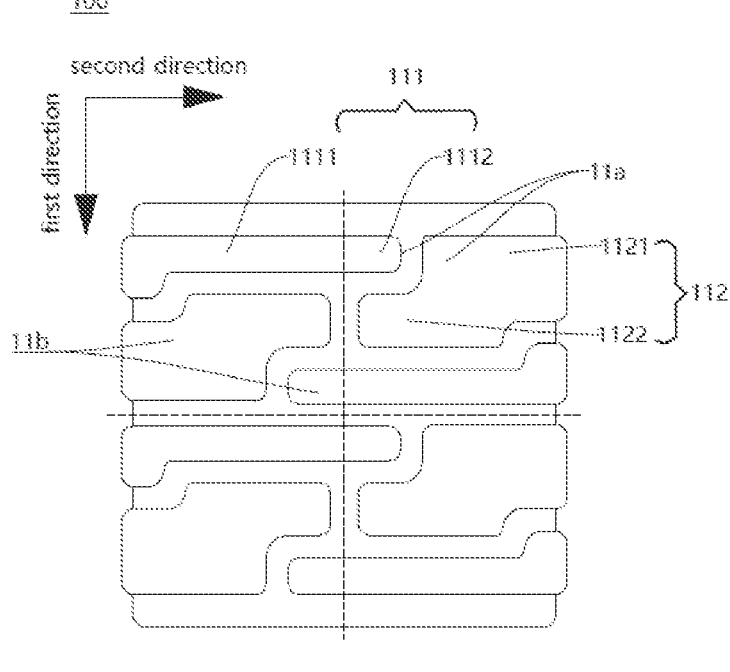
FIG. 2 illustrates a schematic rear structural view of the light-emitting chip holder illustrated in FIG. 1.

In order to observe the structure of the electrically-conductive base 10 more clearly, FIG. 2 illustrates a rear view of the light-emitting chip holder 100 illustrated in FIG. 1. In particular, the connection pad 111 includes a main portion 1111 and an extension portion 1112, and the bonding pad 112 includes a first bonding portion 1121 and a second bonding portion 1122.

Referring to FIG. 1 again, the casing 20 is disposed on the electrically-conductive base 10, and forms concave groups 21 on a side of the electrically-conductive base 10. In combination with the orientation shown in FIG. 1, the casing 20 forms four concaves arranged in two rows and two columns on the electrically-conductive base 10, left and right concaves in each row together constitute one concave group 21. For ease of description, the two concaves in one concave group 21 are called as a first concave 211 and a second concave 212, respectively. That is, each concave group 21 includes the first concave 211 and the second concave 212 adjacent to each other in the second direction. A side of each concave of the multiple concaves formed by the casing 20 close to the electrically-conductive base 10 can be called as concave bottom of the concave. FIG. 1 illustrates two concave groups 21, i.e., an upper concave group and a lower concave group. The multiple pad pairs 11 include a first pad pair 11a and a second pad pair 11b adjacent to each other. Each of the first pad pair 11a and the second pad pair 11b includes one connection pad 111 and one bonding pad 112.

As illustrated in FIG. 1, the concave group 21 in the first row shown in FIG. 1 is taken as an example, as to the first pad pair 11a in the concave group 21 (i.e., the pad pair 11 in the first row of the four pad pairs illustrated in FIG. 1), the main portion 1111 of the connection pad 111 is located in the first concave 211, the extension portion 1112 of the connection pad 111 is connected to the main portion 1111 and extends into the second concave 212 along the second direction, the first bonding portion 1121 of the bonding pad 112 is located in the second concave 212 and arranged adjacent to the extension portion 1112 in the second direction, and the second bonding portion 1122 of the bonding pad 112 is connected to a side of the first bonding portion 1121 close to the second pad pair 11b.

Continuing referring to FIG. 1, for the concave group 21 in the first row, the second pad pair 11b (i.e., the pad pair 11 in the second row of the four pad pairs illustrated in FIG. 1) and the first pad pair 11a are arranged in a centrosymmetric manner in the concave group 21. Specifically, for the second pad pair 11b, the main portion 1111 of the connection pad 111 is located in the second concave 212, the extension portion 1112 of the connection pad 111 is connected to the main portion 1111 and extends into the first concave 211 along the second direction, the first bonding portion 1121 of the bonding pad 112 is located in the first concave 211 and arranged adjacent to the extension portion 1112 in the second direction, and the second bonding portion 1122 of the bonding pad 112 is connected to a side of the first bonding portion 1121 close to the first pad pair 11a. Since the second pad pair 11b and the first pad pair 11a are arranged in a centrosymmetric manner, by translating or rotating, two bowl-shaped structures can be performed with similar die bonding and wire bonding operations, which can greatly reduce the difficulty of subsequent die bonding and wire bonding operations.

The orientation shown in FIG. 1 is taken as an example for description, the connection pad 111 is approximately L-shaped, or a linear structure instead; and the bonding pad 112 is approximately Z-shaped, or is approximately L-shaped in an alternative embodiment. The connection pad 111 of the first pad pair 11a extends from right to left and extends into the second concave 212 from the first concave 211; the connection pad 111 of the second pad pair 11b extends from left to right and extends into the first concave 211 from the second concave 212. As seen from FIG. 1, the first concave 211 is disposed inside with the main portion 1111 of the connection pad 111 of the first pad pair 11a, the first bonding portion 1121 and the second bonding portion 1122 of the bonding pad 112 of the second pad pair 11b, and the extension portion 1112 of the connection pad 111 of the second pad pair 11*b*; the second concave 212 is disposed inside with the extension portion 1112 of the connection pad 111 of the first pad pair 11*a*, the first bonding portion 1121 and the second bonding portion 1122 of the bonding pad 112 of the first pad pair 11*a*, and the main portion 1111 of the connection pad 111 of the second pad pair 11*b*. In other words, each of the first concave 211 and the second concave 212 is disposed inside with three connectable pads, which facilitate series-connection or parallel-connection for light-emitting chips inside adjacent concaves, and make each concave have at least one pair of electrodes respectively extending out from two opposite sides of the light-emitting chip holder 100, so that light-emitting chips after die bonding and wire bonding operations can achieve all positive electrodes are located at a same side (all negative electrodes are also located at another same side). As a result, the light-emitting chips subsequently can be connected to an external circuit more conveniently, and the positive and negative electrodes can be easily identified by giving a mark on any corner of the casing 20 of the light-emitting device. For example, as per the orientation shown in FIG. 1, four positive electrodes may be located on the left and four negative electrodes are located on the right, or, the four negative electrodes are located on the left and the four positive electrodes are located on the right instead. The illustration of FIG. 1 is taken as an example, an electrode mark is formed on the lower left corner, indicating the negative electrodes (or the positive electrodes) are all on the left, and of course, the illustrated embodiment does not limit the position of the electrode mark to that shown in FIG. 1. In an exemplary embodiment, when one light-emitting chip is secured inside the first concave 211, a cathode (or an anode) thereof may be connected to the extension portion 1112 of the connection pad 111 of the second pad pair 11*b*, and the negative electrode (or the positive electrode) is connected to the left; while the anode (or the cathode) thereof may be connected to the main portion 1111 of the connection pad 111 of the first pad pair 11*a* or the bonding pad 112 of the second pad pair 11*b*, and the positive (or the negative) is connected to the right.

Compared with the existing LED holder of which one concave only has one pair of positive and negative electrodes, the light-emitting chip holder of the illustrated embodiment provides more possible connection manners for light-emitting chips secured in the first concave 211 and the second concave 212. For example, the first concave 211 and the second concave 212 are disposed inside with respective light-emitting chips, anodes of the two light-emitting chips may be both connected to the connection pad 111 of the first pad pair 11*a*, and two cathodes of the two light-emitting chips may be both connected to the connection pad 111 of the second pad pair 11*b*, so that the two light-emitting chips are connected in parallel. In another exemplary embodiment, the anode and the cathode of one light-emitting chip are respectively connected to the connection pad 111 and the bonding pad 112 of the first pad pair 11*a*, and the anode and the cathode of the other one light-emitting chip are respectively connected to the connection pad 111 and the bonding pad 112 of the second pad pair 11*b*, so that the two light-emitting chips are independent from each other. In still another exemplary embodiment, the anode of one light-emitting chip is connected to the bonding pad 112 of the second pad pair 11*b*, the cathode of the one light-emitting chip is connected to the connection pad 111 of the first pad pair 11*a*, the anode of the other one light-emitting chip is connected to the connection pad 111 of the first pad pair 11*a*, and the cathode of the other one light-emitting chip is connected to the connection pad 111 of the second pad pair 11*b*, so that the two light-emitting chips are connected in series. Of course, the above-described connection manners are only examples and cannot be used as a condition of limiting embodiments of the disclosure.

In addition, as seen from FIG. 1, the first bonding portion 1121 and the second bonding portion 1122 of the bonding pad 112 are connected to together form a Z-shaped structure, i.e., the bonding pad 112 is disposed on the corresponding extension portion 1112 from left and lower sides (or right and upper sides), such shape design makes an area of the bonding pad 112 be as large as possible, so that the bonding pad 112 can be used for die bonding of a light-emitting chip with a larger size, and can also increase the heat dissipation area, thereby improving the luminous efficiency. In addition, in one concave group 21, the first pad pair 11*a* and the second pad pair 11*b* are arranged in a centrosymmetric manner, so that the layout of the electrically-conductive base 10 is more compact, ensuring a greater space utilization. Moreover, in order to make subsequent connection of the light-emitting chip holder 100 with an external circuit more conveniently, the bonding pad 112 gives an avoidance area at a location close to outside of the light-emitting chip holder 100 to the main portion 1111 of the connection pad 111 inside the same concave, so that portions exposed outside of the casing 20 of the bonding pad 112 and the connection pad 111 have sufficient sizes to facilitate an electrical test after packaging is completed, and thus the first bonding portion 1121 and the second bonding portion 1122 of the bonding pad 112 are connected to form the Z-shaped structure, and the connection pad 111 as a whole is approximately L-shaped. In an alternative embodiment, the avoidance area is not a necessary choice, the first bonding portion 1121 and the second bonding portion 1122 of the bonding pad 112 may be connected together to be approximately L-shaped, and the connection pad 111 as a whole is a linear structure.

Figure 3:
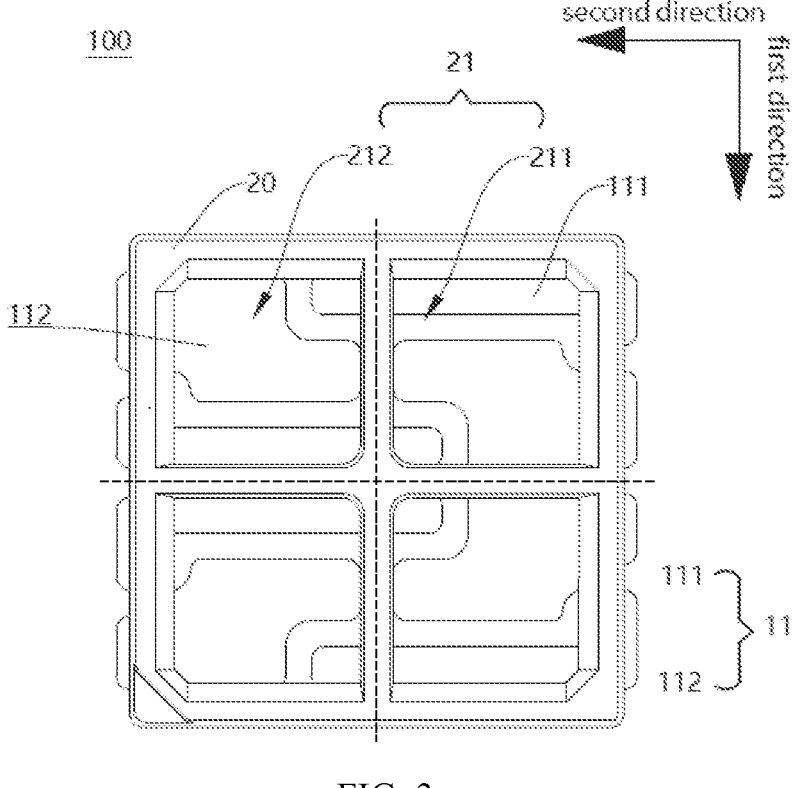
FIG. 3 illustrates a schematic front structural view of another light-emitting chip holder according to an embodiment of the disclosure.
Figure 4:
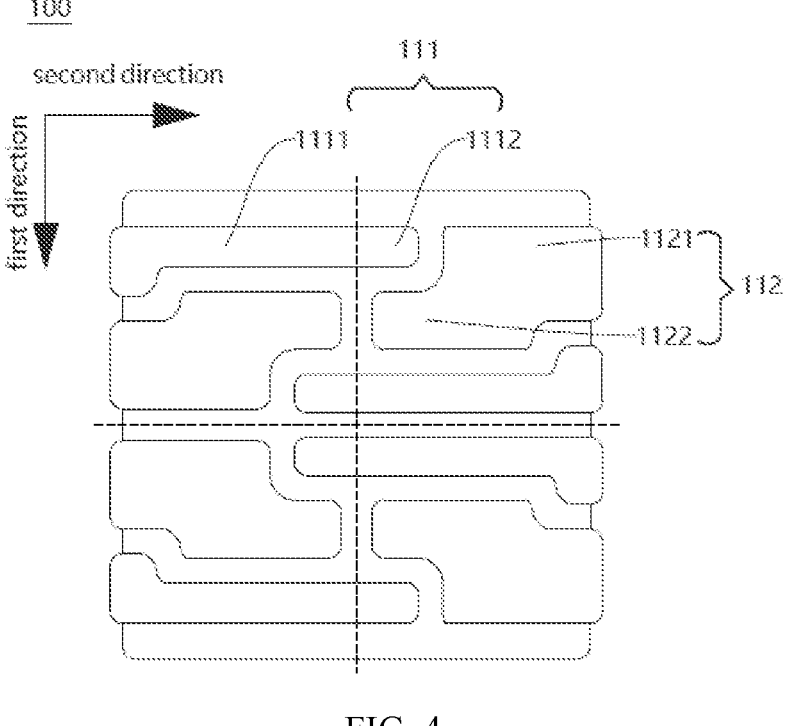
FIG. 4 illustrates a schematic rear structural view of the light-emitting chip holder illustrated in FIG. 3.

The pad pairs 11 in the light-emitting chip holder 100 being four pairs and the number of the concave groups 21 being two is taken as an example, the first pad pair 11*a* and the second pad pair 11*b* in each concave group 21 are used as one pad group, and thus four pad pairs 11 are divided into two pad groups. As seen from the embodiment illustrated in FIG. 1 and FIG. 2, the two pad groups are arranged with the same orientation along the first direction, i.e., the two pad groups have the same arrangement direction, as exemplarily illustrated in FIG. 1, in the first row, the bonding pad 112 is on the left and the connection pad 111 is on the right; and in the second row, the connection pad 111 is on the left and the bonding pad 112 is on the right. Such setting of the holder makes the whole light-emitting chip holder 100 being roughly centrosymmetric. Or, in the embodiment illustrated in FIG. 3 and FIG. 4, the two pad groups are symmetrically arranged with respect to an axis in the second direction, and the transversal dashed line in each of FIG. 3 and FIG. 4 is the axis. The illustration of FIG. 3 is taken as an example, in the first concave group 21, in the first row, the bonding pad 112 is on the left and the connection pad 111 is on the right, and in the second row, the connection pad 111 is on the left and the bonding pad 112 is on the right; while in the second concave group 21, in the first row, the connection pad 111 is on the left and the bonding pad 112 is on the right, and in the second row, the bonding pad 112 is on the left and the connection pad 111 is on the right. Such setting of the holder makes relative sizes and relative positions of the bonding pads and the connection pads in the respective concaves are similar, so that the convenience of subsequent operations such as die bonding and wire bonding on the holder can be well guaranteed, thereby greatly reducing the cost of subsequent processing.

Figure 5:
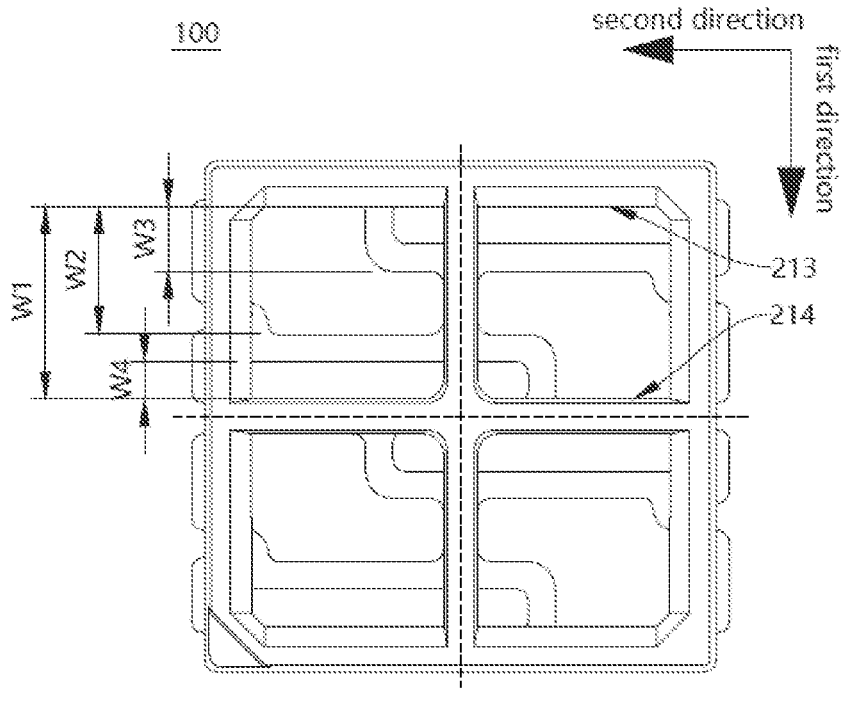
FIG. 5 illustrates a schematic view with dimension markings of the light-emitting chip holder illustrated in FIG. 1.

Referring to FIG. 5, dimensions of the light-emitting chip holder 100 will be described as follows. In some embodiments, the concave group 21 has a first bottom edge 213 and a second bottom edge 214 opposite to each other in the first direction. The first bottom edge 213 is located at a side of the first pad pair 11a facing away from the second pad pair 11b, and the second bottom edge 214 is located at a side of the second pad pair 11b facing away from the first pad pair 11a. As illustrated in FIG. 5, the concave group 21 in the first row is taken as an example, the first bottom edge 213 is an upper bottom edge of the concave group 21, the second bottom edge 214 is a lower bottom edge of the concave group 21, the first pad pair 11a is a pad pair close to the upper bottom edge, and the second pad pair 11b is a pad pair close to the lower bottom edge. Each of the first pad pair 11a and the second pad pair 11b is partially or entirely located between the first bottom edge 213 and the second bottom edge 214. As shown in FIG. 5, an upper edge of the bonding pad 112 and an upper edge of the connection pad 111 of the first pad pair 11a are located at a side of the first bottom edge 213 facing away from the second bottom edge 214, and a lower edge of the bonding pad 112 and a lower edge of the connection pad 111 of the first pad pair 11a are located between the first bottom edge 213 and the second bottom edge 214. A lower edge of the bonding pad 112 and a lower edge of the connection pad 111 of the second pad pair 11b are located at a side of the second bottom edge 214 facing away from the first bottom edge 213, and an upper edge of the bonding pad 112 and an upper edge of the connection pad 111 of the second pad pair 11b are located between the first bottom edge 213 and the second bottom edge 214.

In an embodiment, a distance between the first bottom edge 213 and the second bottom edge 214 is a concave bottom width W1. A distance from an edge of the bonding pad 112 of the first pad pair 11a close to the second pad pair 11b to the first bottom edge 213 is a first bonding width W2, and the first bonding width W2 is greater than ½ of the concave bottom width W1. For example, in the light-emitting chip holder 100 with a model number 3838 (i.e., contour dimensions are 3.8 mm*3.8 mm), the concave bottom width W1 is about 1.43 mm, the first bonding width W2 may be about 0.73-0.95 mm, i.e., the first bonding width W2 is 51%-66% of the concave bottom width W, which can ensure that the die boning area is sufficiently large and thus can be bonded with a light-emitting chip with larger size. In addition, the size of the first bonding width W2 makes, when a light-emitting chip is secured on the bonding pad 112, the light-emitting chip be located at a central position of the concave as far as possible and relatively far away from the casing 20, thereby reducing the impact of heat released by the light-emitting chip on the casing 20, making output light of the entire light-emitting device more uniform, and avoiding a height loss caused by sidewalls of the chip being too close to the casing 20 when the chip is large in size.

Moreover, continuing referring to FIG. 5, a distance from an edge of the second bonding portion 1122 of the first pad pair 11a away from to the second pad pair 11b to the first bottom edge 213 is a second bonding width W3, and the second bonding width W3 is greater than ⅓ of the concave bottom width W1 and smaller than ½ of the concave bottom width W1. For example, in the light-emitting chip holder 100 with a model number 3838 (i.e., contour dimensions are 3.8 mm*3.8 mm), the concave bottom width W1 is about 1.43 mm, the second bonding width W3 may be 0.48 mm-0.7 mm, that is, the second bonding width W3 is 33%-49% of the concave bottom width W1. A difference between the first bonding width W2 and the second bonding width W3 can be regarded as a width of the second bonding portion 1122, and may be in a range of 0.25 mm-0.47 mm.

In some embodiments, a width W4 from an edge of the connection pad 111 of the first pad pair 11a close to the second pad pair 11b to the first bottom edge 213 (i.e., a width from an edge of the connection pad 111 of the second pad pair 11b close to the first pad pair 11a to the second bottom edge 214) can be regarded as a width of the connection pad 111 inside the corresponding concave, and when the W4 of the light-emitting chip holder 100 at different sizes is in a range of 0.28 mm-0.5 mm, a width required for electrical connection with a light-emitting chip can be ensured. In some embodiments, the W4 is generally smaller than 0.35 mm. In addition, a length of the extension portion 1112 of the connection pad 111 in the second direction is greater than or equal to 0.28 mm. A spacing width among the multiple pad pairs 11, and a spacing width between the connection pad 111 and the boding pad 112 each are greater than or equal to 0.2 mm.

Figure 6:
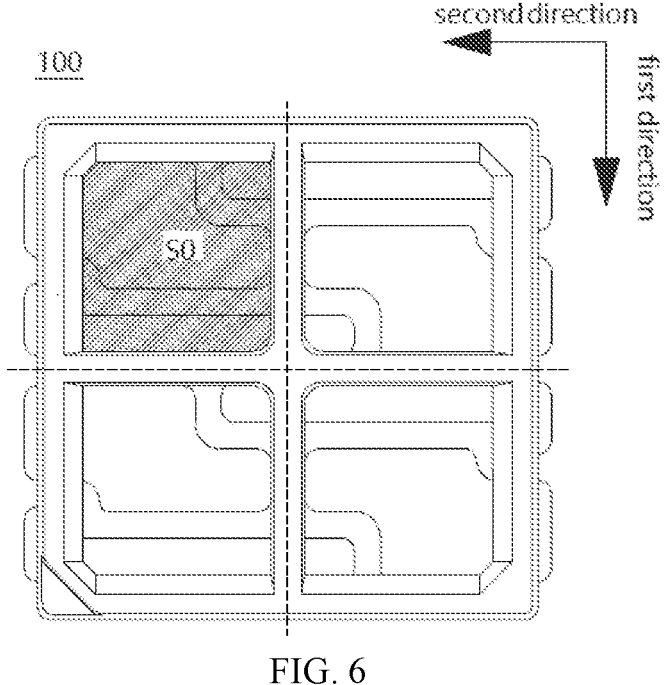
FIG. 6 illustrates a schematic view with a marked area of a concave bottom of a second concave of the light-emitting chip holder illustrated in FIG. 1.
Figure 7:
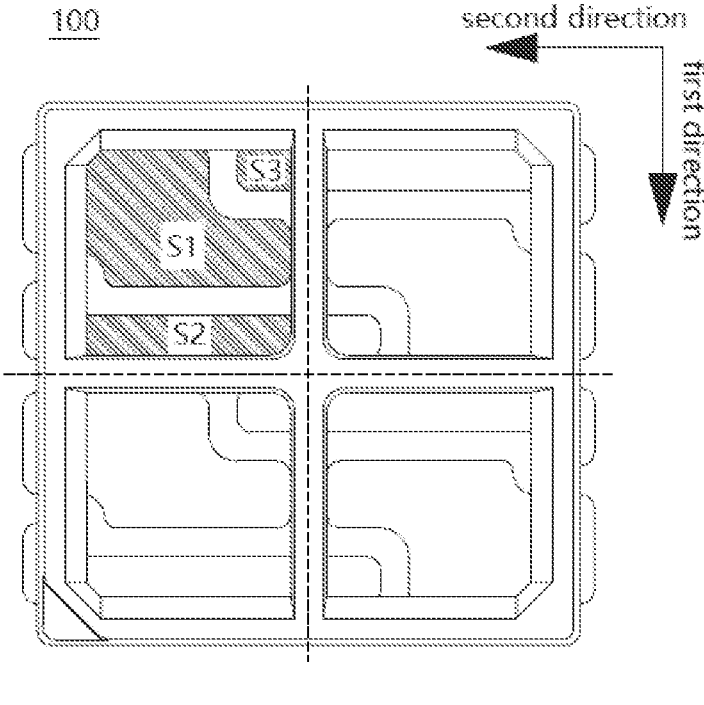
FIG. 7 illustrates a schematic view with marked areas of respective pads in the second concave of the light-emitting chip holder illustrated in FIG. 1.

In some embodiments, the second concave 212 has a concave bottom connected with the electrically-conductive base 10. An area of the concave bottom is denoted as S0 in FIG. 6, an area of the bonding pad 112 of the first pad pair 11a connected with the concave bottom is denoted as S1 in FIG. 7, and S1 is greater than 40% of S0. In some embodiments, S1 is 41.4%-54.2% of the area S0 of the concave bottom, so as to provide a larger die bonding area.

Figure 8:
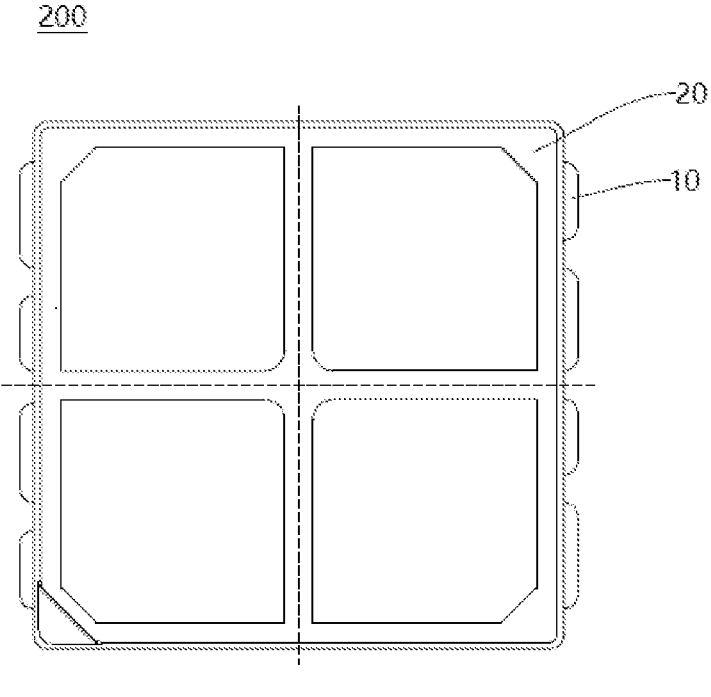
FIG. 8 illustrates a schematic front structural view of a light-emitting device according to an embodiment of the disclosure.

Another embodiment of the disclosure provides light-emitting device 200 including the light-emitting chip of any one of the above embodiments. The light-emitting device 200 further includes: light-emitting chips 30, electrically connected to the electrically-conductive base 10. The first concave 211 and the second concave 212 of each the concave group 21 are disposed with the respective light-emitting chips 30. The light-emitting device 20 exemplarily further includes fluorescent powder and packaging glue filled in the concaves. FIG. 8 illustrates the light-emitting device 200 after packaging.

The light-emitting device 200 as provided in the illustrated embodiment uses the above-described light-emitting chip holder 100, and thus has characteristics such as capable of realizing series-connection and/or parallel-connection flexibly, providing a relatively large die bonding area and achieving good heat dissipation. Regarding detailed connection manners between the light-emitting chips 300 and the electrically-conductive base 10, please refer to FIG. 9 through FIG. 12.

Referring to FIG. 9 through FIG. 12, each of the concaves of the light-emitting chip holder 100 is disposed one light-emitting chip 30 therein, but the illustrated embodiment does not limit the number/amount of the light-emitting chips 30 in each concave. For ease of description, the concave group 21 in the first row is taken as an example for description, the light-emitting chip 30 disposed in the first concave 211 is denoted as a first light-emitting chip 31, the light-emitting chip 30 disposed in the second concave 212 is denoted as a second light-emitting chip 32, the first light-emitting chip 31 is secured on the bonding pad 112 of the second pad pair 11b, and the second light-emitting chip 32 is secured on the bonding pad 112 of the first pad pair 11a. As a result, the first light-emitting chip 31 may be located at a position near a center of the first concave 211, and the second light-emitting chip 32 may be located at a position near a center of the second concave 212, thereby achieving good heat dissipation effect, reducing the influence on a material of the casing 20 10 caused by heat generated during working, making output light of the whole light-emitting device more uniform, and avoiding a height loss caused by sidewalls of the chips being too close to the casing 20 when the chips are large in size. It should be noted that, in the illustrated embodiment, it seems that the light-emitting chips each are mainly secured on the second bonding portion of the bonding pad in a direction parallel to the first or second direction, but it is not limited to this, and it can also be secured on any position of the bonding pad in any direction different from the first or second direction, preferably secured on a position close to the center of the corresponding concave.

Figure 9:
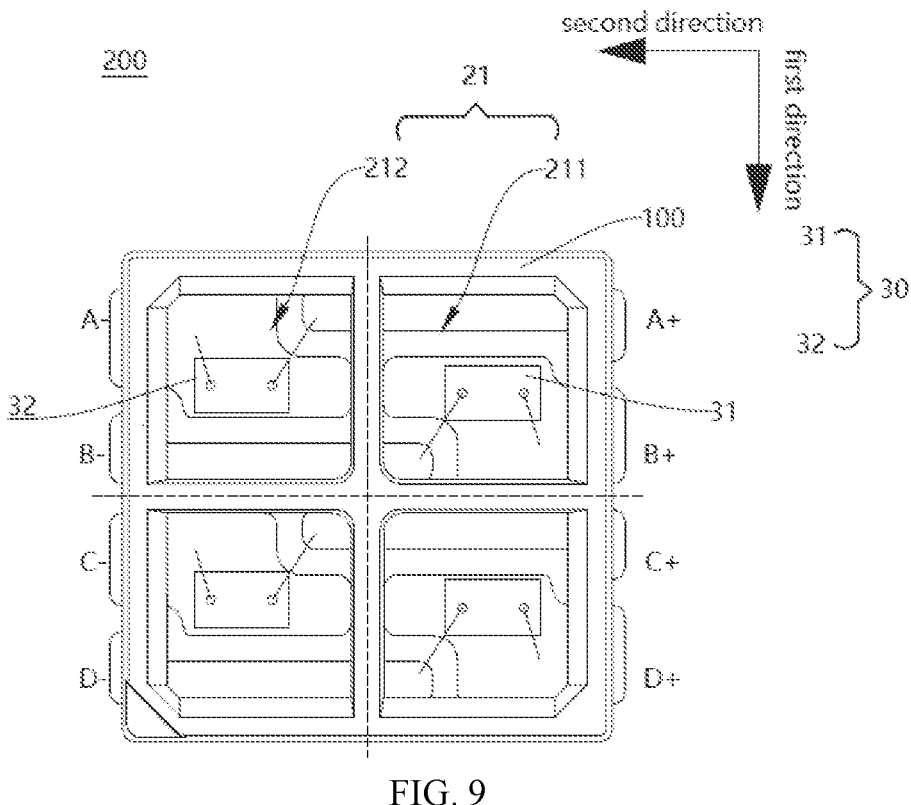
FIG. 9 illustrates a schematic view of a circuit connection of the light-emitting device illustrated in FIG. 8.

Referring to FIG. 9, the concave group 21 in the first row is taken as an example. Two electrodes of the first light-emitting chip 31 are respectively electrically connected to the connection pad 111 and the bonding pad 112 of the second pad pair 11b. Two electrodes of the second light-emitting chip 32 are respectively electrically connected to the connection pad 111 and the bonding pad 112 of the first pad pair 11a. The first light-emitting chip 31 and the second light-emitting chip 32 are independently connected. A circuit corresponding to the first light-emitting chip 31 is a circuit corresponding to B−/B+ pins. A circuit corresponding to the second light-emitting chip 32 is a circuit corresponding to A−/A+ pins. In addition, two light-emitting chips 30 in the concave group 21 in the second row may refer to the above independent connection manner, and circuits corresponding thereto are a circuit corresponding to C−/C+ pins and a circuit corresponding to D−/D+ pins, respectively. As a result, four channels of independent connections are shown in FIG. 9. Of course, the positive-negative electrode orientation shown in FIG. 9 is only for example and cannot be used as a condition limiting the understanding of this embodiment.

Figure 10:
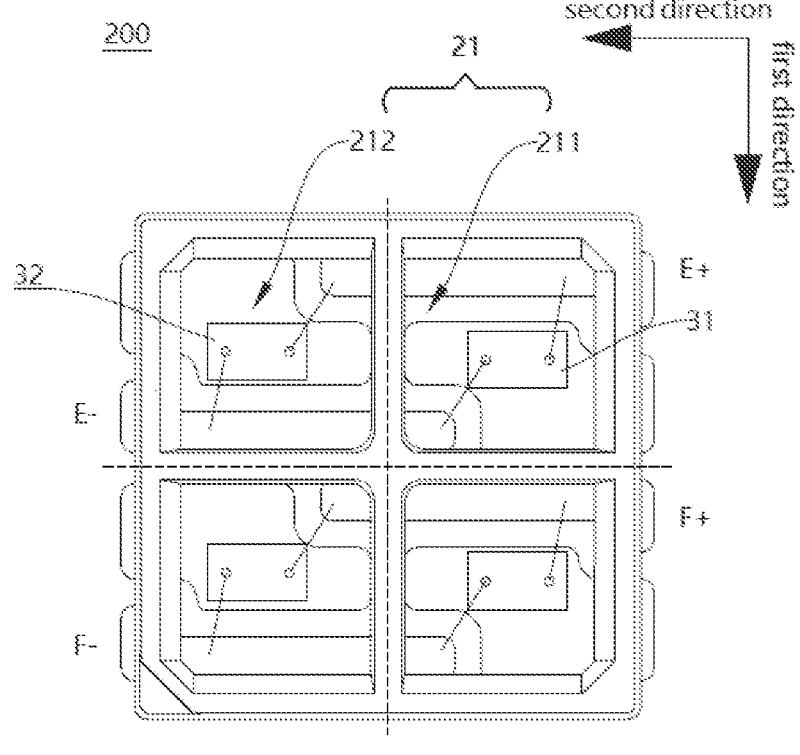
FIG. 10 illustrates a schematic view of another circuit connection of the light-emitting device illustrated in FIG. 8.

In another embodiment, the concave group 21 in the first row as illustrated in FIG. 10 is taken as an example; the second light-emitting chip 32 and the first light-emitting chip 31 are connected in parallel. One of the two electrodes of the first light-emitting chip 31 is electrically connected to the main portion 1111 of the connection pad 111 of the first pad pair 11a, and the other one of the two electrodes of the first light-emitting chip 31 is electrically connected to the extension portion 1112 of the connection pad 111 of the second pad pair 11b. One of the two electrodes of the second light-emitting chip 32 is connected to the extension portion 1112 of the connection pad 111 of the first pad pair 11a, and the other one of the two electrodes of the second light-emitting chip 32 is connected to the main portion 1111 of the connection pad 111 of the second pad pair 11b. As illustrated in FIG. 10, the first light-emitting chip 31 and the second light-emitting chip 32 are connected in parallel to a circuit corresponding to E−/E+ pins. The concave group 21 in the second row can refer to the above parallel-connection manner, and thus the first light-emitting chip 31 and the second light-emitting chip 32 are connected in parallel to a circuit corresponding to F−/F+ pins. As a result, pairwise parallel-connections are formed in FIG. 10. Of course, the positive-negative electrode orientation shown in FIG. 10 is only for example and cannot be used as a condition limiting the understanding of this embodiment.

Figure 11:
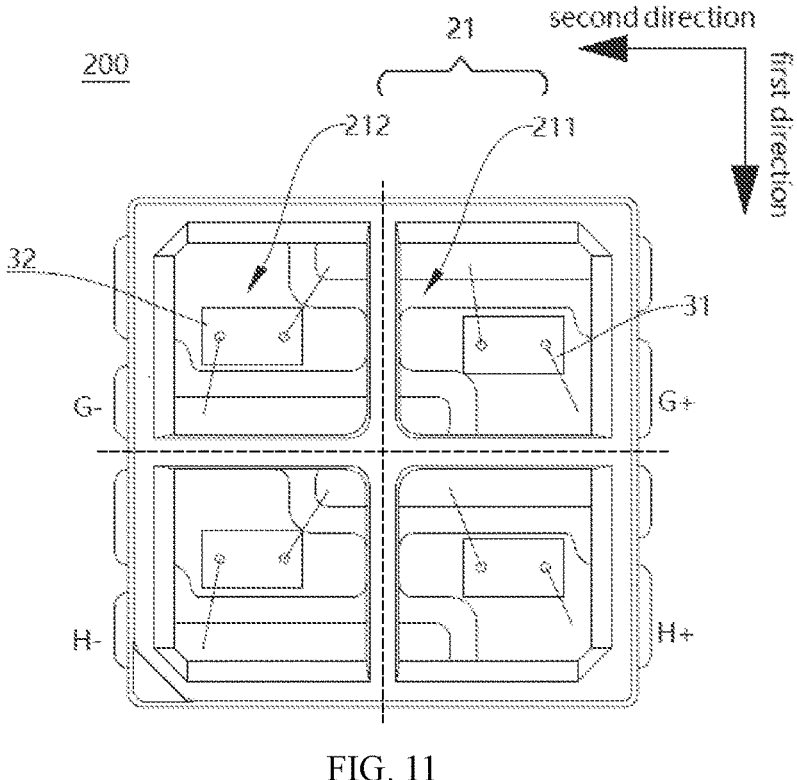
FIG. 11 illustrates a schematic view of still another circuit connection of the light-emitting device illustrated in FIG. 8.

In still another embodiment, the concave group 21 in the first row as illustrated in FIG. 11 is taken as an example, the first light-emitting chip 31 and the second light-emitting chip 32 are connected in series. One of the two electrodes of the first light-emitting chip 31 is connected to the bonding pad 112 of the second pad pair 11b, and the other one of the two electrodes of the first light-emitting chip 31 is connected to the main portion 1111 of the connection pad 111 of the first pad pair 11a. One of the two electrodes of the second light-emitting chip 32 is connected to the extension portion 1112 of the connection pad 111 of the first pad pair 11a, and the other one of the two electrodes of the second light-emitting chip 32 is connected to the main portion 1111 of the connection pad 111 of the second pad pair 11b. As illustrated in FIG. 11, the first light-emitting chip 31 and the second light-emitting chip 32 are connected in series to a circuit corresponding to G−/G+ pins.

The concave group 21 in the second row can refer to the above series-connection manner, and thus the first light-emitting chip 31 and the second light-emitting chip 32 are connected in series to a circuit corresponding to H−/H+ pins. As a result, pairwise series-connections are formed in FIG. 11. Of course, the positive-negative electrode orientation shown in FIG. 11 is only for example and cannot be used as a condition limiting the understanding of this embodiment.

Figure 12:
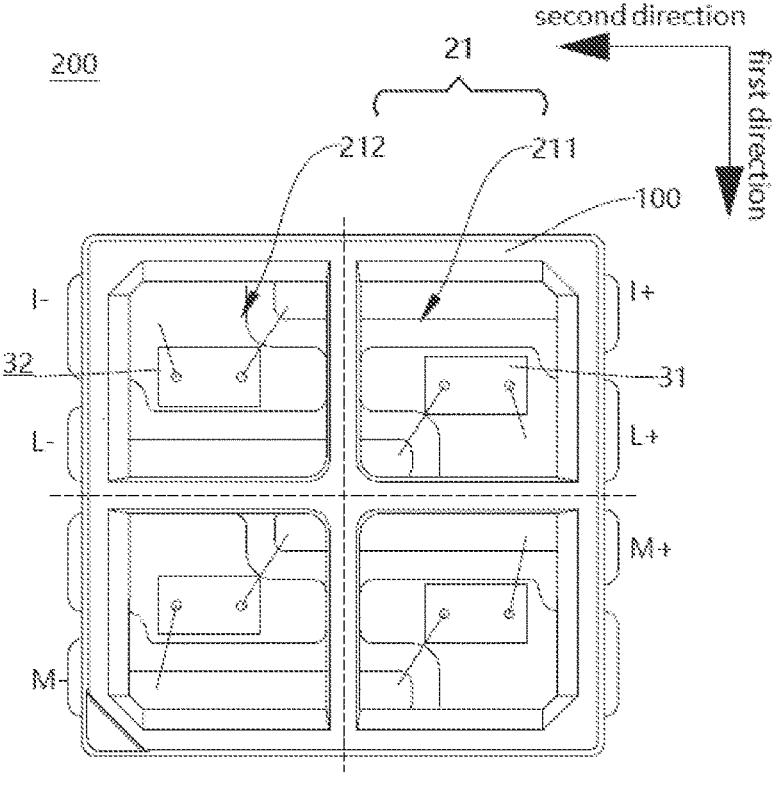
FIG. 12 illustrates a schematic view of even still another circuit connection of the light-emitting device illustrated in FIG. 8.

In some embodiments, for example a mixed connection manner as shown in FIG. 12, two light-emitting chips 30 disposed in the concave group 21 in the first row are independently connected, and circuits corresponding thereto are a circuit corresponding to I−/I+ pins and a circuit corresponding to L−/L+ pins, respectively. Of course, the positive-negative electrode orientation shown in FIG. 12 is only for example and cannot be used as a condition limiting the understanding of this embodiment.

In the light-emitting device 200, different colored lights can be set according to different connection manners of the light-emitting chips 30, so as to realize multi-colored light display, thereby achieving different light mixing effects.

Moreover, in some embodiments, as illustrated in FIG. 1 through FIG. 4, the light-emitting chip holder 100 includes an electrically-conductive base 10 and a casing 20. The electrically-conductive base includes a plurality of pad pairs 11 arranged at intervals along a first direction, and each pad pair 11 of the plurality of pad pairs 11 includes a connection pad 111 and a bonding pad 112 arranged at an interval along a second direction different from the first direction. The casing 20 is disposed on the electrically-conductive base 10 and forming a plurality of concave groups 21 on a side of the electrically-conductive base 10. The plurality of concave groups 21 are spaced in the first direction, and each of the plurality of concave groups 21 include a first concave 211 and a second concave 212 adjacent to each other in the second direction. The plurality of pad pairs 11 includes a first pad pair 11a and a second pad pair 11b adjacent to each other together serving as one pair of pad pairs. The pair of pad pairs have two connection pads 111 and two bonding pads 112, the two connection pads 111 and the two bonding pads 112 are separated from one another and are one-piece structures respectively, the two bonding pads 112 are configured (i.e., structured and arranged) to bear light-emitting chips respectively, each of the two connection pads 111 is exposed in both the first concave 211 and the second concave 212, and each of the two bonding pads 112 is exposed in one of the first concave 211 and the second concave 212 but not exposed in the other one of the first concave 211 and the second concave 212. Moreover, as seen from FIG. 2 or FIG. 4, each of the two bonding pads 112 partially extends into an overlapped region of the two connection pads 111 observed along the first direction. In addition, as seen from FIG. 1 or FIG. 3, each of the two connection pads 111 and the two bonding pads 112 outwardly extends across a peripheral edge of the casing 20.

The above description is only preferred embodiments of the disclosure, and is not intended to limit the disclosure in any form. Although the disclosure has been disclosed in the preferred embodiments above, it is not intended to limit the disclosure. Any person skilled in the art can make some changes or equivalent embodiments modified with equivalent changes by using the above disclosed technical content without departing from technical solutions of the disclosure. Any simple modifications, and equivalent changes and modifications made to the above embodiments according to the technical essence of the disclosure without departing from the technical content of the disclosure still fall within the scope of the technical solutions of the disclosure.

What is claimed is:

1. A light-emitting chip holder, comprising:

a conductive base, wherein the conductive base comprises a plurality of pad pairs spaced along a first direction, each pad pair of the plurality of pad pairs comprises a connection pad and a bonding pad spaced along a second direction, the second direction is different from the first direction, the connection pad comprises a main portion, an extension portion and a first protruding portion, and the bonding pad comprises a first bonding portion, a second bonding portion and a second protruding portion; and a casing, disposed on the conductive base and forming at least one concave group, wherein the at least one concave group each comprises a first concave and a second concave adjacent to each other in the second direction;

wherein the plurality of pad pairs comprises a first pad pair and a second pad pair adjacent to each other; for the first pad pair, the main portion is located in the first concave, the extension portion is connected to the main portion and extends into the second concave along the second direction, the first bonding portion is located in the second concave and adjacent to the extension portion in the second direction, and the second bonding portion connected to a side of the first bonding portion facing toward the second pad pair; and in the concave group, the first pad pair and the second pad pair are arranged in a centrosymmetric manner;

wherein for the first pad pair, the first protruding portion is connected to the main portion, the first protruding portion extends facing away from the extension portion in the second direction and exceeding a circumferential edge of the casing and thereby is exposed out of the casing;

wherein for the first pad pair, the second protruding portion is connected to another side of the first bonding portion facing away from the second pad pair, the second protruding portion extends in the second direction exceeding the circumferential edge of the casing and thereby is exposed out of the casing.

2. The light-emitting chip holder according to claim 1, wherein a number of the plurality of pad pairs is four, and a number of the at least one concave group is two; the first pad pair and the second pad pair in each of the two concave groups serve as one pad group, two the pad groups are arranged with the same orientation along the first direction.

3. The light-emitting chip holder according to claim 1, wherein the concave group has a first bottom edge and a second bottom edge opposite to each other in the first direction, the first bottom edge is located on a side of the first pad pair facing away from the second pad pair, a distance between the first bottom edge and the second bottom edge is a concave bottom width, a distance from an edge of the bonding pad of the first pad pair facing towards the second pad pair to the first bottom edge is a first bonding width, and the first bonding width is greater than ½ of the concave bottom width.

4. The light-emitting chip holder according to claim 3, wherein a distance from an edge of the second bonding portion of the first pad pair facing away from the second pad pair to the first bottom edge is a second bonding width, and the second bonding width is greater than ⅓ of the concave bottom width and smaller than ½ of the concave bottom width.

5. The light-emitting chip holder according to claim 1, wherein the second concave has a concave bottom connected with the conductive base, and an area of the bonding pad connected with the concave bottom, of the first pad pair is greater than or equal to 40% of an area of the concave bottom.

6. A light-emitting device, comprising:

the light-emitting chip holder according to claim 1; and light-emitting chips, electrically connected to the conductive base, wherein each of the first concave and the second concave of the concave group is disposed the light-emitting chip therein.

7. The light-emitting device according to claim 6, wherein a number of the plurality of pad pairs is four, and a number of the at least one concave group is two; the first pad pair and the second pad pair in each of the two concave groups serve as one pad group, two the pad groups are arranged with the same orientation along the first direction.

8. The light-emitting device according to claim 6, wherein the concave group has a first bottom edge and a second bottom edge opposite to each other in the first direction, the first bottom edge is located on a side of the first pad pair facing away from the second pad pair, a distance between the first bottom edge and the second bottom edge is a concave bottom width, a distance from an edge of the bonding pad of the first pad pair facing towards the second pad pair to the first bottom edge is a first bonding width, and the first bonding width is greater than ½ of the concave bottom width.

9. The light-emitting device according to claim 8, wherein a distance from an edge of the second bonding portion of the first pad pair facing away from the second pad pair to the first bottom edge is a second bonding width, and the second bonding width is greater than ⅓ of the concave bottom width and smaller than ½ of the concave bottom width.

10. The light-emitting device according to claim 6, wherein the second concave has a concave bottom connected with the conductive base, and an area of the bonding pad connected with the concave bottom, of the first pad pair is greater than or equal to 40% of an area of the concave bottom.

11. The light-emitting device according to claim 6, wherein the light-emitting chips comprise a first light-emitting chip disposed in the first concave and a second light-emitting chip disposed in the second concave; two electrodes of the first light-emitting chip are electrically connected to the connection pad and the bonding pad of the second pad pair, respectively; and two electrodes of the second light-emitting chip are electrically connected to the connection pad and the bonding pad of the first pad pair.

12. The light-emitting chip holder according to claim 1, wherein for the second pad pair, the main portion is located in the second concave, the extension portion is connected to the main portion and extends into the first concave along the second direction, the first bonding portion is located in the first concave and adjacent to the extension portion in the second direction, and the second bonding portion connected to a side of the first bonding portion facing toward the first pad pair;

wherein for the second pad pair, the first protruding portion is connected to the main portion, the first protruding portion extends facing away from the extension portion in the second direction and exceeding the circumferential edge of the casing and thereby is exposed out of the casing;

wherein for the second pad pair, the second protruding portion is connected to another side of the first bonding portion facing away from the first pad pair, the second protruding portion extends in the second direction exceeding the circumferential edge of the casing and thereby is exposed out of the casing.

13. The light-emitting chip holder according to claim 1, wherein for the first pad pair, the connection pad is a one-piece structure and penetrates from a front surface of the conductive base facing towards the casing to a rear surface of the conductive base facing away from the casing, the bonding pad is a one-piece structure and penetrates from the front surface of the conductive base facing towards the casing to the rear surface of the conductive base facing away from the casing;

wherein for the second pad pair, the connection pad is a one-piece structure and penetrates from the front surface of the conductive base facing towards the casing to the rear surface of the conductive base facing away from the casing, the bonding pad is a one-piece structure and penetrates from the front surface of the conductive base facing towards the casing to the rear surface of the conductive base facing away from the casing.

14. The light-emitting device according to claim 6, wherein the light-emitting chips comprise a first light-emitting chip disposed in the first concave and a second light-emitting chip disposed in the second concave, the first light-emitting chip is secured on the bonding pad of the second pad pair, and the second light-emitting chip is secured on the bonding pad of the first pad pair.

15. A light-emitting chip holder, comprising:

a conductive base, wherein the conductive base comprises a plurality of pad pairs arranged at intervals along a first direction, and each pad pair of the plurality of pad pairs comprises a connection pad and a bonding pad arranged at an interval along a second direction different from the first direction; and a casing, disposed on the conductive base and forming a plurality of concave groups on a side of the conductive base, wherein the plurality of concave groups is spaced in the first direction, and each of the plurality of concave groups comprises a first concave and a second concave adjacent to each other in the second direction;

wherein the plurality of pad pairs comprises a first pad pair and a second pad pair adjacent to each other, and the first pad pair and the second pad pair together serve as one set of pad pairs;

wherein the one set of pad pairs has two the connection pads and two the bonding pads, the two connection pads and the two bonding pads are separated from one another and are one-piece structures respectively, the two bonding pads are configured to bear light-emitting chips respectively, one of the two connection pads is exposed in both the first concave and the second concave, the other one of the two connection pads is exposed in both the first concave and the second concave, and each of the two bonding pads is exposed in one of the first concave and the second concave but not exposed in the other one of the first concave and the second concave;

wherein each of the two connection pads extends in the second direction exceeding a circumferential edge of the casing and intersecting with the circumferential edge of the casing, and thereby is partially exposed out of the casing;

wherein each of the two bonding pads extends in the second direction exceeding the circumferential edge of the casing and intersecting with the circumferential edge of the casing, and thereby is partially exposed out of the casing.

16. The light-emitting chip holder according to claim 15, wherein each of the two bonding pads partially extends into an overlapped region of the two connection pads observed along the first direction.

17. The light-emitting chip holder according to claim 15, wherein each of the two connection pads and the two bonding pads outwardly extends across the circumferential edge of the casing.

18. The light-emitting chip holder according to claim 15, wherein the connection pad comprises a main portion and an extension portion, and the bonding pad comprises a first bonding portion and a second bonding portion;

for the first pad pair, the main portion is located in the first concave, the extension portion is connected to the main portion and extends into the second concave along the second direction, the first bonding portion is located in the second concave and adjacent to the extension portion in the second direction, and the second bonding portion connected to a side of the first bonding portion facing toward the second pad pair;

for the second pad pair, the main portion is located in the second concave, the extension portion is connected to the main portion and extends into the first concave along the second direction, the first bonding portion is located in the first concave and adjacent to the extension portion in the second direction, and the second bonding portion connected to a side of the first bonding portion facing toward the first pad pair.

19. The light-emitting chip holder according to claim 18, wherein each of the plurality of concave groups has a first bottom edge and a second bottom edge opposite to each other in the first direction, the first bottom edge is located on a side of the first pad pair facing away from the second pad pair, a distance between the first bottom edge and the second bottom edge is a concave bottom width, a distance from an edge of the bonding pad of the first pad pair facing towards the second pad pair to the first bottom edge is a first bonding width, and the first bonding width is greater than ½ of the concave bottom width.

20. The light-emitting chip holder according to claim 19, wherein a distance from an edge of the second bonding portion of the first pad pair facing away from the second pad pair to the first bottom edge is a second bonding width, and the second bonding width is greater than ⅓ of the concave bottom width and smaller than ½ of the concave bottom width.

* * * * *